United States Patent
Gooray et al.

(10) Patent No.: US 6,472,332 B1
(45) Date of Patent: Oct. 29, 2002

(54) SURFACE MICROMACHINED STRUCTURE FABRICATION METHODS FOR A FLUID EJECTION DEVICE

(75) Inventors: Arthur M. Gooray, Penfield, NY (US); George J. Roller, Penfield, NY (US); Joseph M. Crowley, Morgan Hill, CA (US); Paul C. Galambos, Albuquerque, NM (US); Frank J. Peter, Albuquerque, NM (US); Kevin R. Zavadil, Bernilillo, NM (US); Richard C. Givler, Albuquerque, NM (US); Randy J. Shul, Albuquerque, NM (US); Christi Willison Gober, Albuquerque, NM (US)

(73) Assignee: Xerox Corporation, Stamford, CT (US)

( * ) Notice: Subject to any disclaimer, the term of this patent is extended or adjusted under 35 U.S.C. 154(b) by 25 days.

(21) Appl. No.: 09/723,243

(22) Filed: Nov. 28, 2000

(51) Int. Cl.$^7$ .............................................. H01L 21/302
(52) U.S. Cl. ....................................... 438/745; 438/756
(58) Field of Search ............................. 438/23–25, 700, 438/691–693, 706, 712–714, 717–719, 723, 725, 756, 745

(56) References Cited

U.S. PATENT DOCUMENTS

| | | | |
|---|---|---|---|
| 4,520,375 A | 5/1985 | Kroll .......................... 346/140 |
| 5,501,893 A | 3/1996 | Laermer et al. ............. 428/161 |
| 5,545,512 A | * 8/1996 | Nakato ........................ 430/323 |
| 5,668,579 A | 9/1997 | Fujii et al. ..................... 347/10 |
| 5,754,205 A | 5/1998 | Miyata et al. ................. 347/70 |
| 5,783,340 A | 7/1998 | Farino et al. ................. 430/22 |
| 5,798,283 A | 8/1998 | Montague et al. ............ 438/24 |
| 5,804,084 A | 9/1998 | Nasby et al. ................... 216/2 |
| 5,821,951 A | 10/1998 | Fujii et al. ..................... 347/10 |
| 5,828,394 A | 10/1998 | Khuri-Yakub et al. ........ 347/72 |
| 5,919,548 A | 7/1999 | Barron et al. ............... 438/691 |
| 5,963,788 A | 10/1999 | Barron et al. ................. 438/48 |
| 6,053,208 A | * 4/2000 | Onishi et al. ................. 138/30 |
| 6,082,208 A | 7/2000 | Rodgers et al. ............... 74/406 |
| 6,093,508 A | * 7/2000 | Cote ......................... 430/0.11 |
| 6,127,198 A | 10/2000 | Coleman et al. ............. 438/21 |
| 6,197,696 B1 | * 3/2001 | Aoi ............................. 438/700 |
| 6,267,905 B1 | * 7/2001 | Silverbrook ................. 216/27 |
| 6,139,809 A1 | * 11/2001 | Chang et al. ............... 438/597 |
| 6,357,865 B1 | * 3/2002 | Kubby et al. ................. 347/68 |

\* cited by examiner

Primary Examiner—Robert Kunemund
Assistant Examiner—Duy-Vu Deo
(74) Attorney, Agent, or Firm—Oliff & Berridge, PLC

(57) ABSTRACT

Structures for use in conjunction with surface micromachined structures are formed using a two-step etching process. In various exemplary embodiments, the two-step etching process comprises a modified Bosch etch. According to various exemplary embodiments of the two-step etch, first mask and second masks are used to prepare a layer for etching one or more desired structures. The first mask is used to define at least one large feature. The second mask is used to define at least one small feature (small as compared to the at least one large feature). The second mask is formed over the first mask which is formed over the layer. In the first etching step, the at least one small feature is etched into the layer. Then, the second mask is removed using the chemical rinsing agent. In the second etching step, the at least one large feature is etched into the layer such that the at least one small feature propagates further into the layer ahead of the at least one large feature. The first mask is then removed. Other surface micromachined methods and structures are provided as well.

14 Claims, 14 Drawing Sheets

SURFACE MICROMACHINED STRUCTURE FABRICATION METHODS FOR A FLUID EJECTION DEVICE

BACKGROUND OF THE INVENTION

1. Field of Invention

This invention relates to methods for forming surface micromachined structures to make fluid ejection devices.

2. Description of the Related Art

Polysilicon surface micromachining uses planar fabrication process steps common to the integrated circuit (IC) fabrication industry to manufacture microelectromechanical or micromechanical devices. The standard building-block process consists of depositing and photolithographically patterning alternating layers on a substrate. The alternating layers consist of low-stress polycrystalline silicon (also termed polysilicon) and a sacrificial material such as silicon dioxide on a substrate. Vias etched through the sacrificial layers provide anchor points to the substrate and between the polysilicon layers. The polysilicon layers are patterned to form mechanical elements of the micromachined device. The mechanical elements are thus formed layer-by-layer in a series of deposition and patterning process steps. The silicon dioxide layers are then removed by exposure to a selective etchant, such as hydrofluoric acid (HF), which does not attack the polysilicon layers. This releases the mechanical elements formed in the polysilicon layers for movement thereof.

The resulting micromachined device generally consists of a first layer of polysilicon which provides electrical interconnections and/or a voltage reference plane, and up to three additional layers of polysilicon which include mechanical elements ranging from simple cantilevered beams to complex systems, such as an electrostatic motor connected to a plurality of gears. Typical in-plane lateral dimensions can range from one micron to several hundred microns, while the layer thicknesses are typically about 1–2 microns. Because the entire process is based on standard IC fabrication technology, hundreds to thousands of devices can be batch-fabricated, fully assembled (without any need for piece-part assembly) on a single silicon substrate.

A chemical mechanical polishing (CMP) technique that planarizes the various levels in a multilevel micromachined device to prevent unintended interference between structures on different layers of the micromachined device is described in U.S. Pat. No. 5,804,084 to Nasby et al. In the above-described process, as the relatively thick (2 $\mu$m) layers of polysilicon and oxide are deposited and etched, considerable surface topography arises which imposes limitations in deposition, patterning and etching of subsequent layers. The topography is created as the layers are draped into valleys created by prior etching steps. It is often desirable to planarize specific layers in order to eliminate processing difficulties associated with photoresist step coverage, depth-of-focus of photolithography equipment, and stringer generation during dry etch. The chemical mechanical polishing of intermediate sacrificial layers as disclosed in U.S. Pat. No. 5,804,084 provides relatively simple and quick processing to ameliorate the topography difficulties inherent in multi-level micromachining processes. This avoids the need for additional care in design of structures, special photoresist processes and the use of extra mask levels.

An anisotropic etching process may be used to define structures, for example trenches and ridges or the like having low to average selectivity, into silicon substrates. Individual structures to be etched in are usually defined by etching masks applied to the silicon substrate by way of so-called masking layers, for example, a photoresist layer. In the anisotropic etching technique, it is necessary to achieve a laterally exactly defined recess in the silicon. These deeply-extending recesses must have lateral ends which are as exactly vertical as possible. The edges of the masking layers covering those silicon substrate regions that are not supposed to be etched are not underetched in order to keep the lateral precision of the structural transition from the mask into the silicon as high as possible. As a result, it is necessary to allow the etching to progress only on the bottom of the structures, but not on the already produced side walls of the structures.

To this end, a plasma-etching method may be used to perform etching of profiles in silicon substrates. In such a method, chemically reactive species and electrically-charged particles (ions) are generated in a reactive gas mixture in a reactor with the aid of an electric discharge. The positively-charged cations generated in this manner are accelerated toward the substrate, by means of an electrical prestress applied to the silicon substrate, and fall virtually vertically onto the substrate surface, and promote the chemical reaction of the reactive plasma species with the silicon on the etching base.

A particular type of anisotropic etching process is described in U.S. Pat. No. 5,501,893 to Laermer et al. This particular type of etching process is commonly referred to as a Bosch etch. According to a Bosch etch, the anistropic etching process is achieved by alternating sequential etching and polymerization steps. As a consequence, in an advantageous manner the simultaneous presence of etching species and polymer formers in the plasma is avoided altogether. Hence, deep structures having vertical edges can be realized with very high etching rates in silicon substrates.

SUMMARY OF THE INVENTION

This invention provides methods for forming surface micromachined fluid ejection devices using a two-step etching process. In various exemplary embodiments of the methods of this invention, the two-step etching process comprises a modified Bosch etch that is used to create a structure through which fluid can be brought into an ejection chamber of the fluid ejection device that is defined on a layer, for example, a silicon wafer.

In various exemplary embodiments of the modified Bosch etch according to the methods of this invention, a first mask that defines at least one large feature is formed over a surface of the layer. The first mask is then treated to render the mask inert to a chemical rinsing agent. A second mask that defines at least one small feature is formed over the first mask. The at least one small feature is then etched into the layer. The second mask is removed using the chemical rinsing agent after the at least one small feature is etched. The at least one large feature is then etched into the layer whereby the at least one small feature propagates ahead of the at least one large feature.

In various exemplary embodiments of the modified Bosch etch according to the methods of this invention, the two-step etch is propagated from a back side of a silicon wafer to a front side of the wafer. When the etch reaches the front side of the wafer, the etch stops on a first layer of sacrificial material, such as an oxide, associated with a surface micromachining process. The sacrificial material layer(s) on the front side of the wafer are removed during a release etch, such as a hydrofluoric (HF) etch, to allow the polysilicon structures of the fluid ejector to move, and to open up the Bosch-etched structure in the wafer to create a path through which fluid may enter the ejection chamber of the fluid ejector.

The present invention separately provides methods for forming a surface micromachined device in which a stiffening feature is formed on a substrate-facing surface of a polysilicon layer of the device. In various exemplary embodiments of such methods, at least one cut is formed in a sacrificial material layer such that the at least one cut does not extend completely through the sacrificial material layer. A polysilicon layer is formed over the sacrificial material layer. The sacrificial material layer is then removed such that at least one feature corresponding to the at least one cut is formed on a substrate-facing surface of the polysilicon layer. In various exemplary embodiments, the at least one feature on the substrate-facing surface of the polysilicon layer provides a stiffening rib-like structure, for example, that maintains rigidity of a piston structure formed in the polysilicon layer as the piston structure moves to eject a drop of the fluid.

These and other features and advantages of this invention are described in, or are apparent from, the following detailed description of various exemplary embodiments of the methods and devices according to this invention.

BRIEF DESCRIPTION OF THE DRAWINGS

Various exemplary embodiments of the methods and devices of this invention are described in detail below, with reference to the attached drawing figures, in which.

DETAILED DESCRIPTION OF PREFERRED EMBODIMENTS

Figure 1:
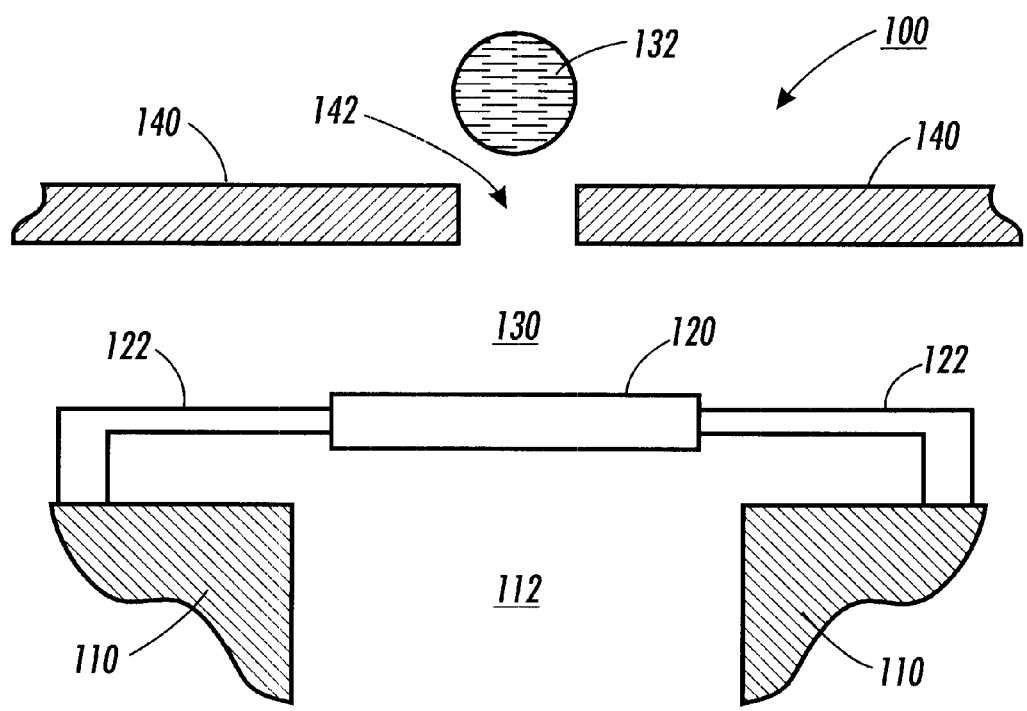
FIG. 1 is a cross-sectional view of a first exemplary embodiment of a fluid ejector according to this invention.

The methods of this invention may be used in the fabrication of a wide variety of surface micromachined fluid ejection devices. For example, surface micromachining techniques may be used for fabricating various types of ink jet ejectors. In particular, electrostatically and magnetically actuated liquid ejectors fabricated using such techniques have the potential for compact, integrated, monolithic (little or no assembly required) fabrication with drop size modulation. Thus, the present invention builds upon existing surface micromachining techniques to provide distinct advantages in the fabrication of surface micromachined devices, in particular, fluid ejectors.

The methods of this invention form structures for use in conjunction with surface micromachined structures using a two-step etching process. In various exemplary embodiments, the two-step etching process comprises a modified Bosch etch. Other etching techniques, for example, conventional wet etch, reactive ion etching (RIE), and/or high-density plasma etch, such as ICP or ECR, may be used. However, the Bosch etch may be desirable for critical dimensions, and may be the only technique practical for obtaining high-aspect ratio, anisotropic, deep Si features and the like.

In various exemplary embodiments of the two-step etch of the present invention, first mask and second masks are used to prepare a layer for etching one or more desired structures. The first mask is used to define at least one large feature. The second mask is used to define at least one small feature (small as compared to the at least one large feature). The first mask is treated to render the mask inert to a chemical rinsing agent, such as acetone. The second mask is not treated and is removable using the chemical rinsing agent.

The second mask is formed over the first mask which is formed over the layer. In the first etching step, the at least one small feature is etched into the layer. Then, the second mask is removed using the chemical rinsing agent. In the second etching step, the at least one large feature is etched into the layer such that the at least one small feature propagates further into the layer ahead of the at least one large feature. The first mask is then removed by any suitable technique, such as hot n-methyl pyrrolidinone or a plasma oxygen strip.

In various exemplary embodiments of such methods, at least one cut is formed in a sacrificial material layer such that the at least one cut extends only partially into the sacrificial material layer. Since the at least one cut does not extend completely through the sacrificial material layer, a polysilicon layer formed over the sacrificial material layer will conform to the at least one cut. Once the sacrificial material layer is removed, at least one feature corresponding to the at least one cut remains on the substrate-facing surface of the polysilicon layer.

Since the methods of the present invention are particularly useful for forming micromachined liquid ejectors, the following embodiments of such a device are provided to facilitate description of exemplary embodiments of the methods in more detail. Of course, the present invention is not limited by the structural features shown or to the methods used to fabricate such structures.

Thus, by way of example only, an embodiment of a single electrostatic ejector 100 is shown in FIG. 1. The ejector 100 comprises an unsealed piston 120 supported by one or more springs 122 connected to a substrate 110 at two or more sides of the piston 120. A faceplate 140 including at least one ejector nozzle 142 is formed at the other side of the piston 120. An ink bath 130 is disposed between the face plate 140 and the substrate 110. The ink bath 130 communicates with an ink supply (not shown) through an ink feed 112 formed in the substrate 110.

The ejector 100 is actuated electrostatically when an electrostatic field is applied between the piston 120 and the faceplate 140 across a fluid in the ink bath 130. For example, a voltage may be applied to the piston 120 while the faceplate 140 is kept at ground potential. This potential difference between the faceplate 140 and the piston 120 generates an electrostatic field across the fluid in the ink bath 130. The electrostatic field produces an electrostatic attractive force that pulls the piston 120 towards the faceplate 140. Movement of the piston 120 forces a drop 132 out of the ejector nozzle 142.

Figure 2:
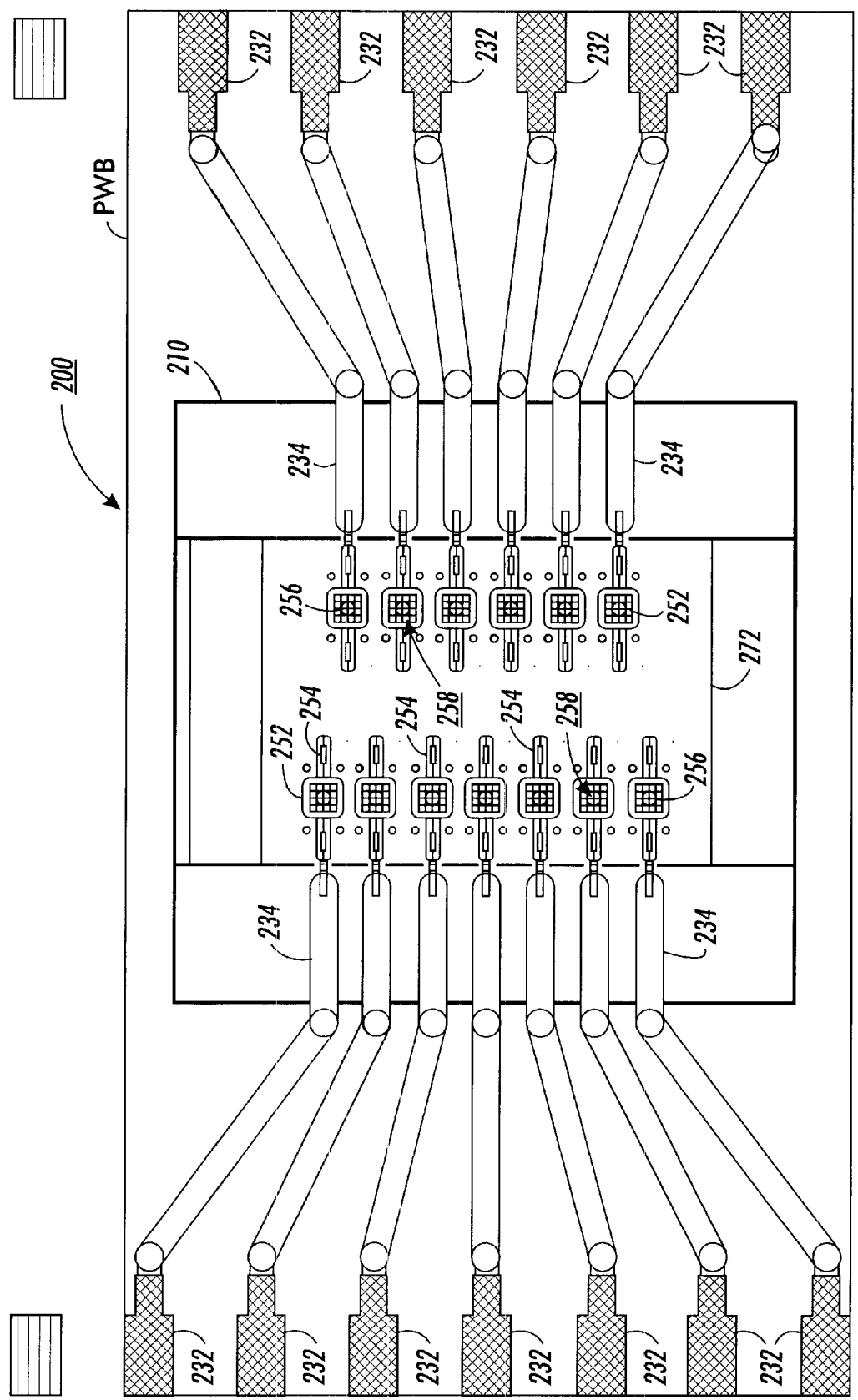
FIG. 2 is a top view of an exemplary embodiment of a print head assembly having a plurality of fluid ejectors according to this invention.

In practice, as shown in FIG. 2, various size arrays of single ejectors 100 may be fabricated to form an ejector print head assembly 200 as desired for a given application. The methods of the present invention will be described in detail as part of an overall fabrication process of the print head assembly 200. Since the methods of the present invention build upon previous fabrication techniques, a description of the overall process is considered helpful.

Fabrication of the ejector print head assembly 200, and that of each individual ejector, is based on a modified SUMMiT process. The SUMMiT processes are covered by various U.S. Patents belonging to Sandia National Labs, including U.S. Pat. Nos. 5,783,340; 5,798,283; 5,804,084; 5,919,548; 5,963,788; and 6,053,208, each of which is incorporated herein by reference in its entirety. The SUMMiT processes are primarily covered by U.S. Pat. Nos. 5,804,084 and 6,053,208.

In the SUMMiT process, layers of polysilicon and silicon dioxide are alternatively deposited, patterned and etched away to produce a three-dimensional structure based on stacked layers of polysilicon. The finishing step in the fabrication process is a release etch that removes all of the silicon dioxide to leave a free standing polysilicon ejector structure behind.

The first step in the SUMMiT process is the deposition of an insulating layer directly on top of a silicon substrate or wafer 210. The insulating layer may be formed by about 0.6 microns of silicon dioxide and about 0.8 microns of low-stress silicon nitride. A first polysilicon layer is then deposited over the substrate 210 and the insulating layer. The first polysilicon layer may be about 0.3 microns thick and may be doped to enhance conductivity.

For supplying a current or voltage to the individual ejectors of the ejector print head assembly 200, a plurality of wire bond pads 232 are patterned or fabricated in the first polysilicon layer. The wire bond pads 232 may have additional layers of polysilicon deposited on top of them as shown in FIG. 2. A metal such as, for example, aluminum or titanium-gold, may be deposited on the wire bond pads 232 to improve electrical contact and to facilitate wire bonding. Electrical traces 234 are also fabricated in the first polysilicon layer leading from the wire bond pads 232.

The electrical traces 234 are electrically isolated from ground by the insulating layer. Also, when a voltage is applied at any of the wire bond pads 232, it is applied along all of a respective one of the isolated electrical traces 234.

The next step in the SUMMiT process is the deposition of a first layer of sacrificial material. Silicon dioxide, for example, may be used as the sacrificial material. The first layer of sacrificial material may be approximately 2.0 microns thick. One or more cuts completely through the first layer of sacrificial material allow a subsequently deposited polysilicon layer to be anchored to the first polysilicon layer and may be used to establish electrical and/or mechanical connections between polysilicon layers.

According to this exemplary embodiment of the invention, an addition patterned etch or cut is made in the first layer of sacrificial material. The etch, however, does not go all the through the first layer of sacrificial material to the first polysilicon layer. On the contrary, the etch extends only partially into the first layer of sacrificial material. The etch is know as a dimple 1 cut. In this particular exemplary embodiment, the dimple 1 cut is used to pattern a plurality of grooves in the first layer of sacrificial material. These grooves may form a checkerboard or grid like pattern.

Next, a second polysilicon layer is deposited over the first layer of sacrificial material. The second polysilicon layer may be approximately 1 micron thick. A plurality of pistons 252 is fabricated in the second polysilicon layer. According to this exemplary embodiment, each of the plurality of pistons 252 is located over a corresponding dimple 1 cut.

An associated plurality of springs 254 are also fabricated in the second polysilicon layer. The plurality of springs 254 are connected to the substrate 210, through the cuts, the first polysilicon layer and the insulating layer, so that the plurality of pistons 252 are supported thereby.

Further, in this exemplary embodiment, the plurality of springs 254 function as an electrical connection between the electrical traces 234 and the plurality of pistons 252. For example, the plurality of springs 254 may complete a current path that carries current from the wire bond pads 232 to the electrical traces 234, through the cuts, and to the plurality of pistons 252. Since there is no exit path for such a current, each of the plurality of pistons 252 and a common faceplate act as a parallel plate capacitor when a voltage is applied to one of the wire bond pads 232. In operation, the plurality of springs 254 also serve to pull each of the plurality of pistons 252 back to its original position after the applied voltage is removed from the wire bond pads 232.

A second layer of sacrificial material is deposited over the second polysilicon layer, and any additional polysilicon layer that may be used to build the structure up for proper spacing between the fabricated structures and features of the various polysilicon layers. The second layer of sacrificial material may be approximately 2 microns thick and may be planarized after deposition using a patented chemical-mechanical polishing technique developed at Sandia National Labs, such as that disclosed in U.S. Pat. No. 5,804,084. Such a polishing step ensures that a subsequent polysilicon layer will be deposited on a flat surface. Thus, any build up in conformality of the previous patterned polysilicon depositions will not extend to subsequent polysilicon layers.

A third polysilicon layer is then deposited over the second layer of sacrificial material. The third polysilicon layer may be about 2 microns thick and forms a common faceplate 272 extending over the entire array of ejectors. Note that only an outline of the faceplate 272 is shown in FIG. 2 so that the plurality of pistons 252, etc. are visible. A plurality of nozzle ejector holes are fabricated in the faceplate 272 above the plurality of pistons 252. The nozzle ejector holes 274 may be approximately 20 microns in diameter.

The finishing step in the process is a release etch. A hydrofluoric acid mixture in a bath is used to remove the layers of sacrificial material (silicon dioxide) throughout the device. The release etch is highly selective to oxide and leaves the polysilicon layers and their structures and features untouched. The release etch is able to penetrate the entire structure through the ejector nozzle holes.

Upon completion of the release etch and removal of the first layer of sacrificial material, the polysilicon material of the second polysilicon layer that was deposited over the dimple 1 cut forms features on a substrate-facing surface of each of the plurality of pistons 252. The polysilicon material of the second polysilicon layer fills the plurality of grooves formed by the dimple 1 cut. Thus, a corresponding plurality of ribs 256 are formed on the substrate-facing surface of each of the plurality of pistons 252. When the plurality of grooves are formed in a grid-like pattern, the resulting plurality of ribs 256 are formed in a waffle iron pattern 258. The plurality of ribs 256 serve to stiffen each of the plurality of pistons 252. This enhances the accuracy, reliability and longevity of the ejector print head assembly 200.

Figure 3:
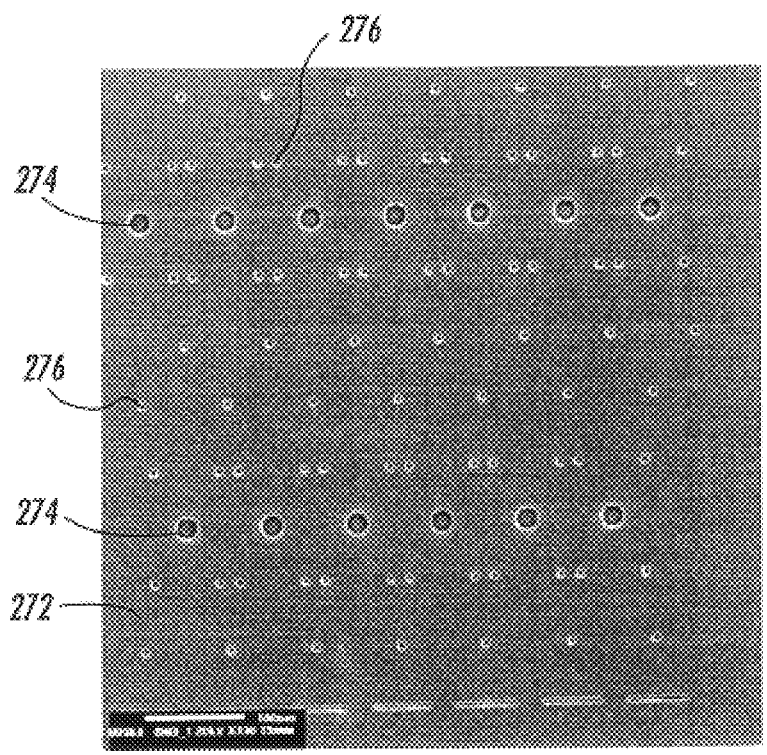
FIG. 3 is a Scanning Electron Microscope (SEM) image showing a top view of an exemplary embodiment of a fluid ejector array fabricated according to this invention.
Figure 4:
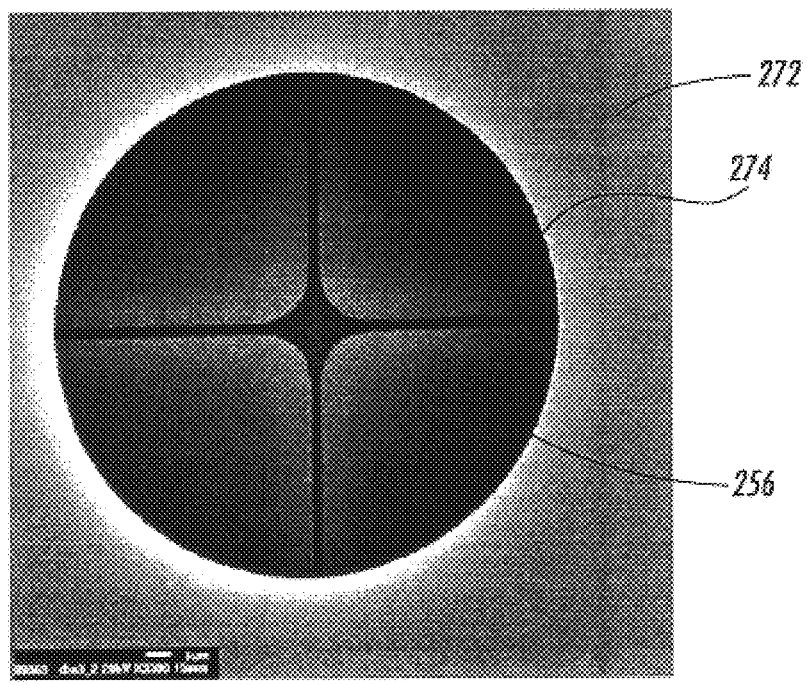
FIG. 4 is a magnified Scanning Electron Microscope (SEM) image of the exemplary embodiment of FIG. 3 focusing on a single ejector nozzle.
Figure 5:
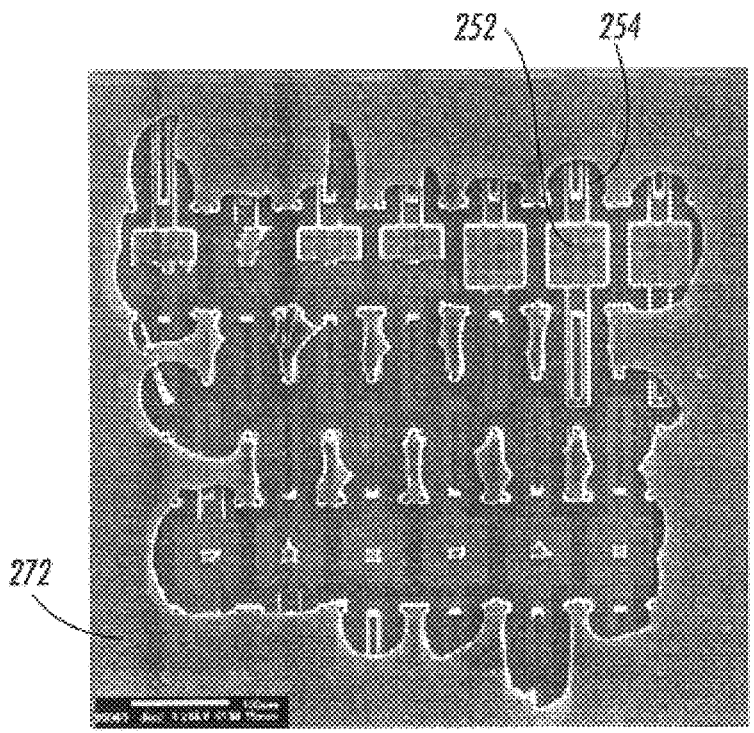
FIG. 5 is a Scanning Electron Microscope (SEM) image showing a partially cut-away top view of the exemplary embodiment of FIG. 3.
Figure 6:
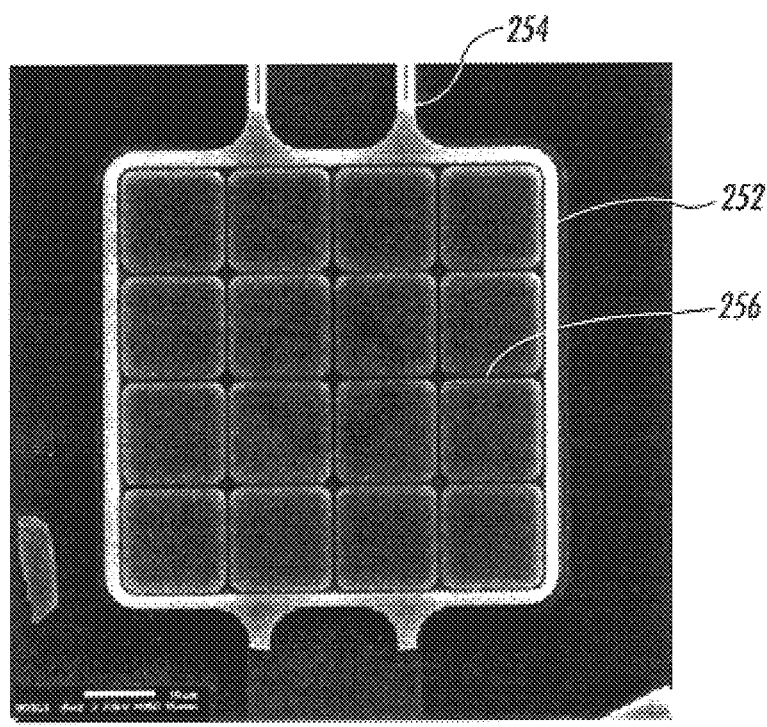
FIG. 6 is a magnified Scanning Electron Microscope (SEM) image of the partially cut-away top view of FIG. 5 focusing on a single piston structure.
Figure 7:
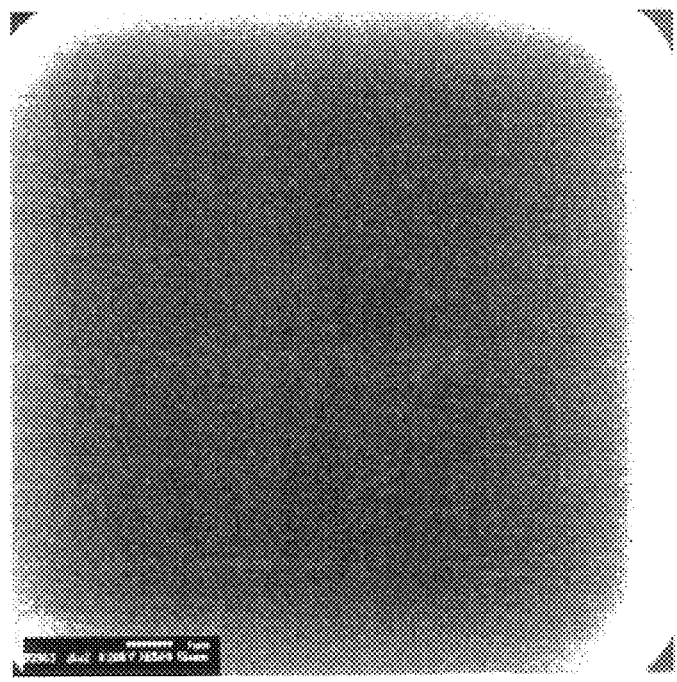
FIG. 7 is a further magnified Scanning Electron Microscope (SEM) image of the partially cut-away top view of FIG. 6.
Figure 8:
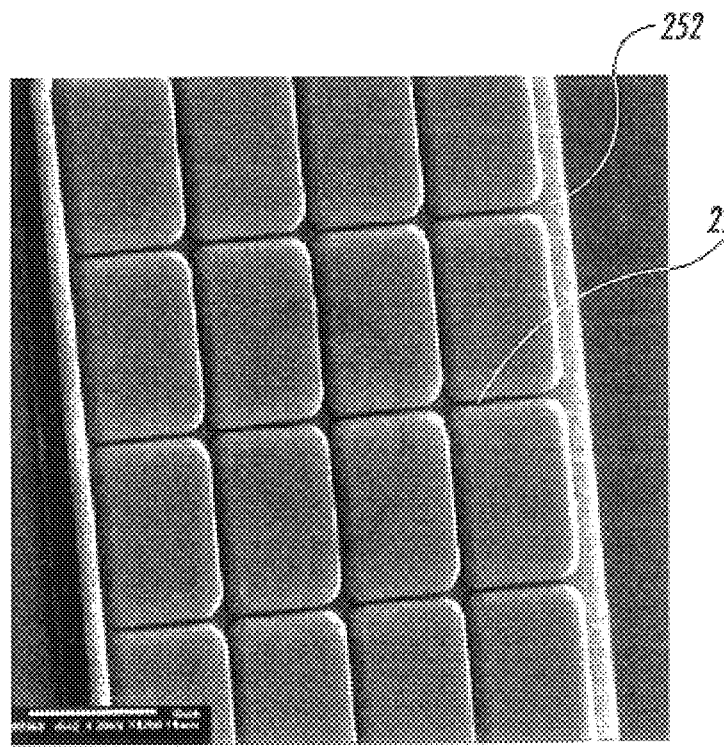
FIG. 8 is a further magnified Scanning Electron Microscope (SEM) image of the partially cut-away top view of FIG. 6, taken at an angle.
Figure 9:
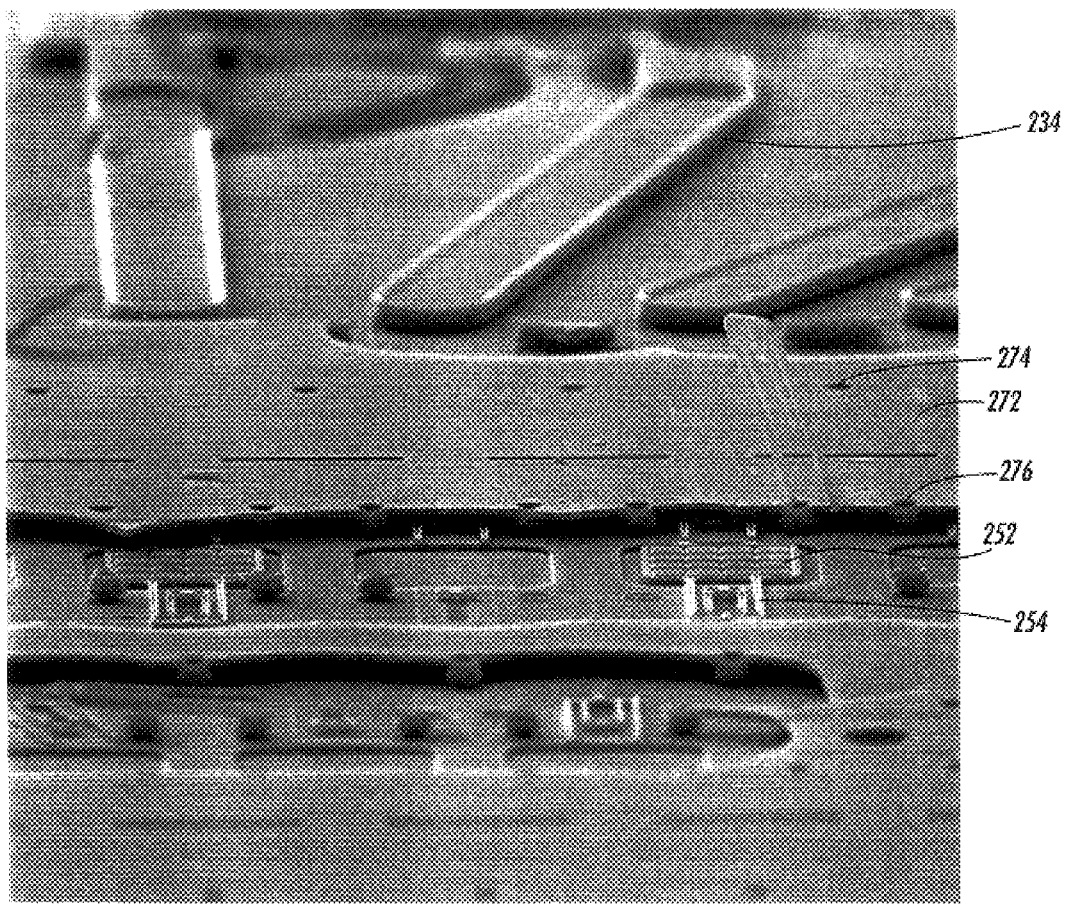
FIG. 9 is a Scanning Electron Microscope (SEM) image showing a partially cut-away top view of the exemplary embodiment of FIG. 3, taken at an angle.

FIGS. 3–9 are SEM (scanning electron microscope) images of an exemplary fluid ejector fabricated as described above. FIG. 3 shows a top view of the faceplate 272 with nozzle ejector holes 274 and faceplate support posts 276. FIG. 4 shows a magnified view focusing on a single nozzle ejector hole 274. The ribs 256 of the piston 252 are visible through the single nozzle ejector hole 274. FIG. 5 shows the faceplate 272 partially cut-away to expose the plurality of pistons 252 and the associated springs 254. FIG. 6 shows a magnified view of a single piston 252 with its springs 254 and ribs 256. FIG. 7 shows a further magnified view of the piston 252. FIG. 8 shows a magnified angled view of the piston 252 and the ribs 256. FIG. 9 shows a partially cut-away top view, taken at an angle, in which the pistons 252, the springs 254, the ribs 256, the faceplate 272, the nozzle ejector holes 274, the faceplate support posts 276 and electrical traces 234 are visible.

Figure 10:
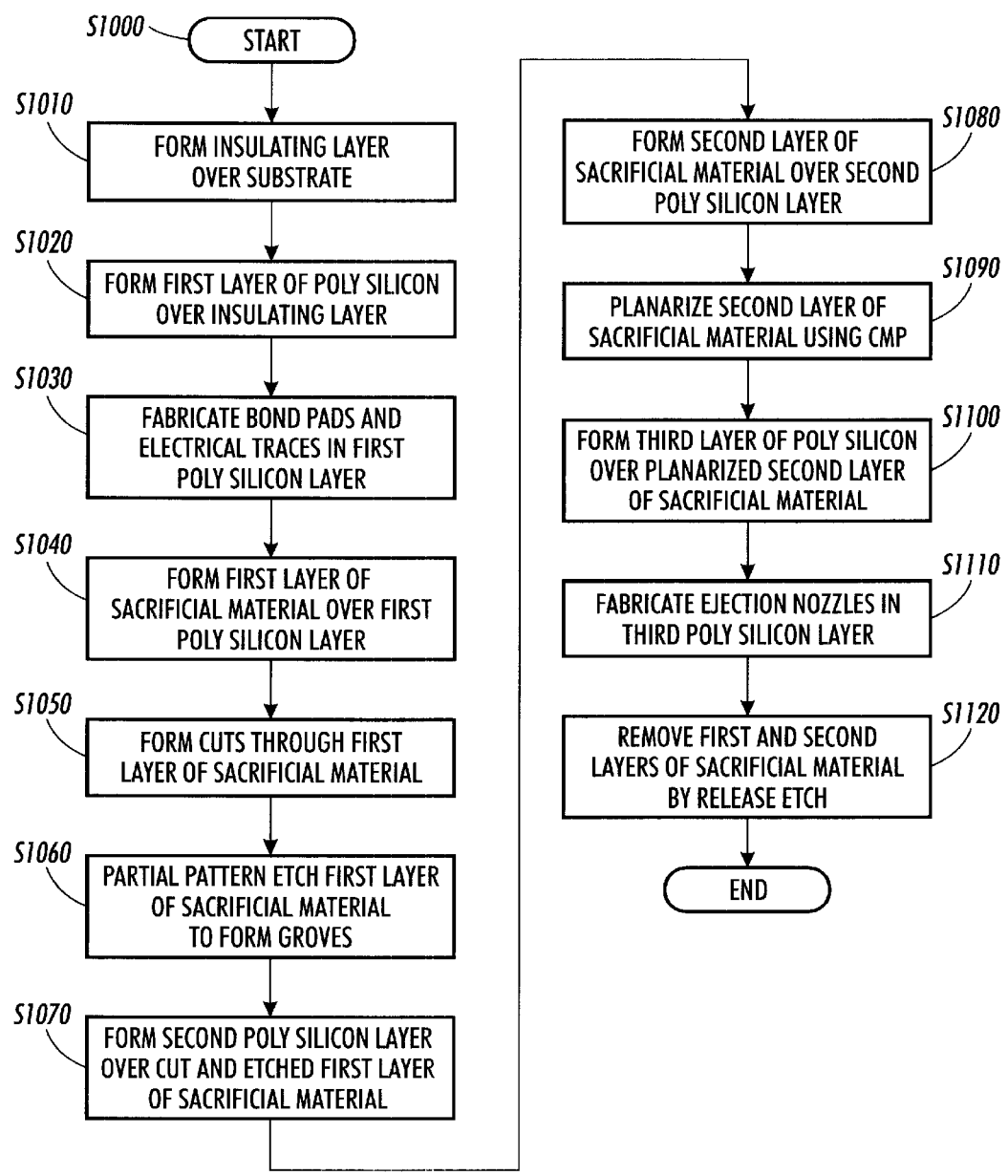
FIG. 10 is a flowchart outlining a first exemplary embodiment of a method for fabricating a fluid ejection device according to this invention.

FIG. 10 provides an exemplary flowchart for a process of fabricating the exemplary embodiments of FIGS. 1–9. The process begins in step S1000. The fluid ejector or fluid ejector array is formed on a substrate. In step S1010, an insulating layer is formed over the substrate. Next, in step S1020, a first layer of polysilicon is formed over the insulating layer. Structures are then fabricated in the first layer of polysilicon using any known or hereafter developed technique. For example, bond pads and electrical traces are fabricated in the first layer of polysilicon in step S1030.

The process continues to step S1040, where a first layer of sacrificial material is formed over the first layer of polysilicon. In step S1050, cuts may be formed through the first layer of sacrificial material so that the first layer of polysilicon may be connected to a subsequent layer of polysilicon and/or structures formed in different polysilicon layers may interact. Next, in step S1060, a partial etch of the first layer of sacrificial material is made, for example, to form a pattern of grooves. A second layer of polysilicon is then formed over the first layer of sacrificial material in step S1070.

After any desired structures are fabricated in the second layer of polysilicon, the second layer of polysilicon is planarized, for example, using chemical-mechanical polishing (CMP), in step S1090. After planarization, a third layer of polysilicon is formed over the second layer of polysilicon in step S1100. Then, in step S1110, the ejection nozzle hole or holes are then fabricated in the third layer of polysilicon.

Finally, in step S1120, the first and second layers of sacrificial material are removed, for example, by a release etch of a hydrofluoric acid mixture. This allows the structures formed in the polysilicon layers to move and allows fluid to flow through the fluid ejector. The process then ends in step S1130.

As the flowchart is only an example, it will be understood that not all steps illustrated are necessary to practice the methods of the present invention. For example, the methods of the present invention are considered to be used in any process in which a partial pattern etch or cut is made in a sacrificial layer to form features or structures on a substrate-facing surface of a layer subsequently deposited on the sacrificial layer.

Figure 17:
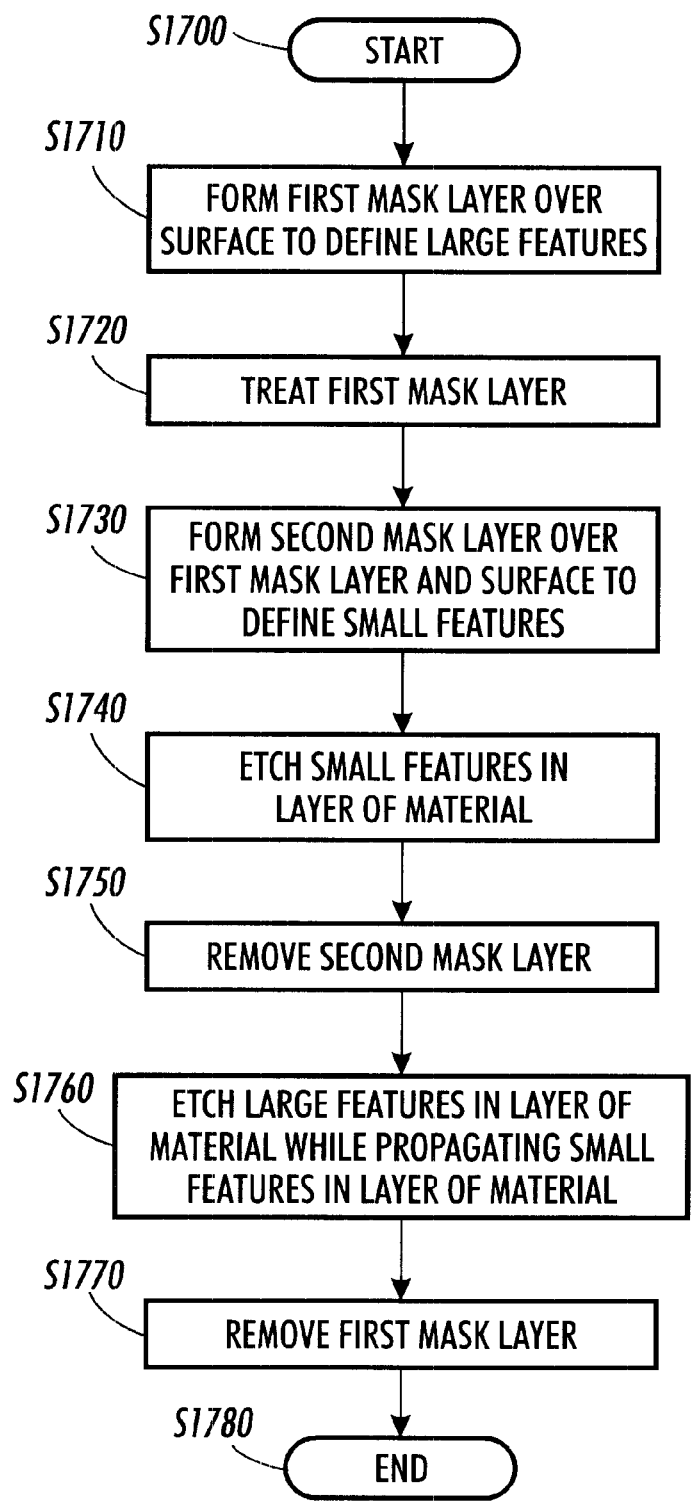
FIG. 17 is a flowchart outlining the second exemplary embodiment of FIGS. 11–16.

In various exemplary embodiments of the methods of the present invention, a unique two-step etching process is provided. An exemplary embodiment of the two-step etching process is described with reference to FIGS. 11–17. FIGS. 11–16 illustrate various phases of the exemplary embodiment and FIG. 17 provides an exemplary flowchart for the process. The exemplary embodiment is a modified Bosch etch that may be referred to as a Bosch propagation etch. U.S. Pat. No. 5,501,893 to Laermer describes the basic Bosch etch.

According to various embodiments, the two-step etch may be used to fabricate a combination of small and large features in a layer. As an example, FIGS. 11–16 show a substrate 1100 subjected to the process. As will be described further below, the small and large features in the example are vias and wells, respectively, that are useful structures in micromachined liquid ejectors.

Figure 11:
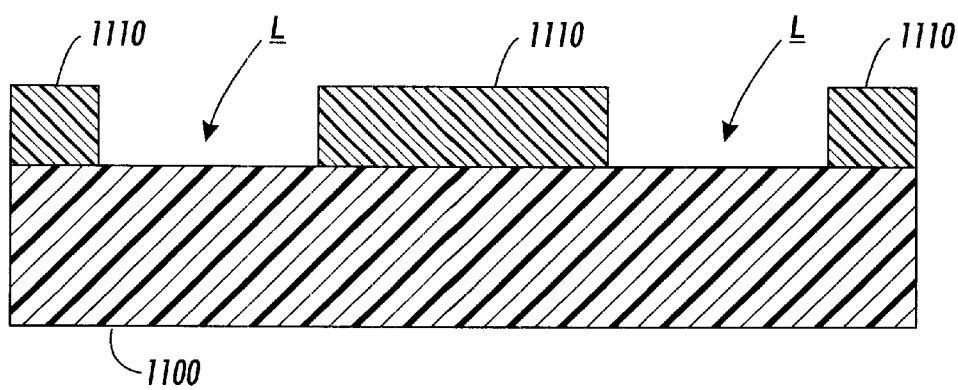
FIGS. 11–16 are elevation views of a layer during various stages of a second exemplary embodiment of a method for fabricating a fluid ejection device according to this invention.

As shown in FIG. 11, a first mask comprising a first photoresist layer 1110 is formed over a surface of the substrate 1100. The first photoresist layer 1110 is used to define at least one large feature L and may be aligned using known techniques, such as, for example, a Karl Suss contact aligner with a wrong reading through the glass 1X contact mask. After the first photoresist layer 1110 is formed, it is hardbaked at approximately 170 degrees Celsius for about one hour. This heat-treatment renders the first photoresist layer 1110 inert to a chemical rinsing agent, for example acetone.

Figure 12:
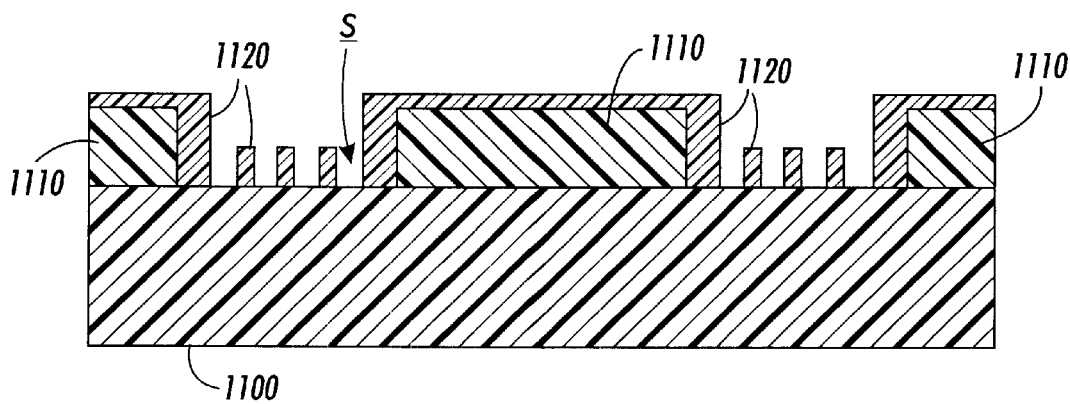

As shown in FIG. 12, a second mask comprising a second photoresist layer 1120 is formed over the first photoresist layer 1110. The second photoresist layer 1120 is used to define at least one small feature S and may be aligned as note above. The second photoresist layer 1120, however, is not subjected to the treatment of the first photoresist layer 1110. Thus, the second photoresist layer 1120 will be affected by application of the chemical rinsing agent.

Figure 13:
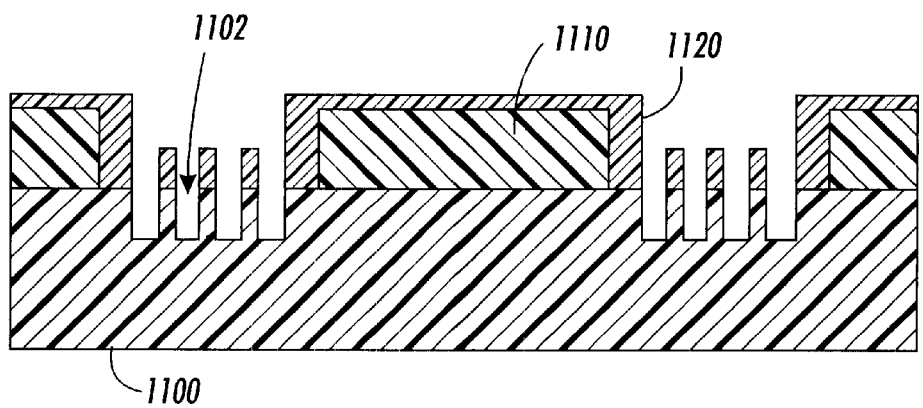

After the second photoresist layer 1120 is formed, the small features S are Bosch etched into the substrate 1100. FIG. 13 illustrates the etched small features as vias 1102. The vias 1102 may be etched into the substrate 1100 by this Bosch etch step, for example, from a few microns to several hundred microns.

Figure 14:
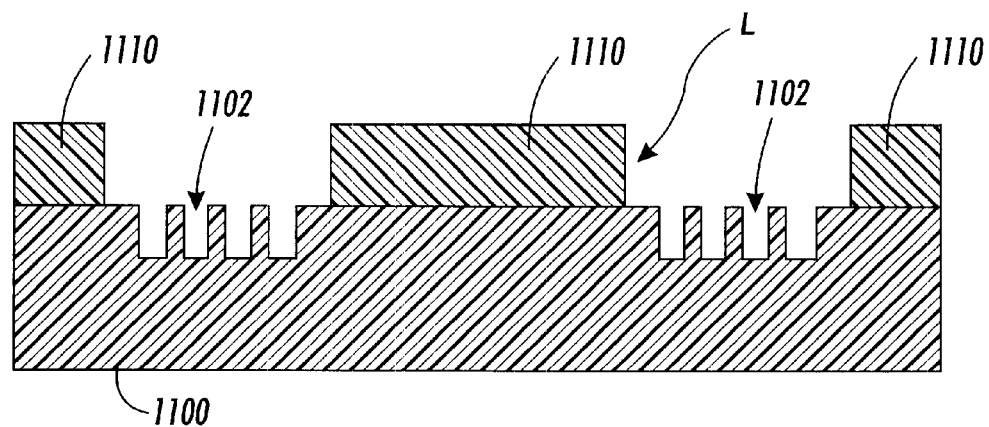

As shown in FIG. 14, the second photoresist layer 1120 is then removed by rinsing in acetone. Since the first photoresist layer 1110 is inert to the chemical rinsing agent acetone, the first photoresist layer 1110 remains intact.

Figure 15:
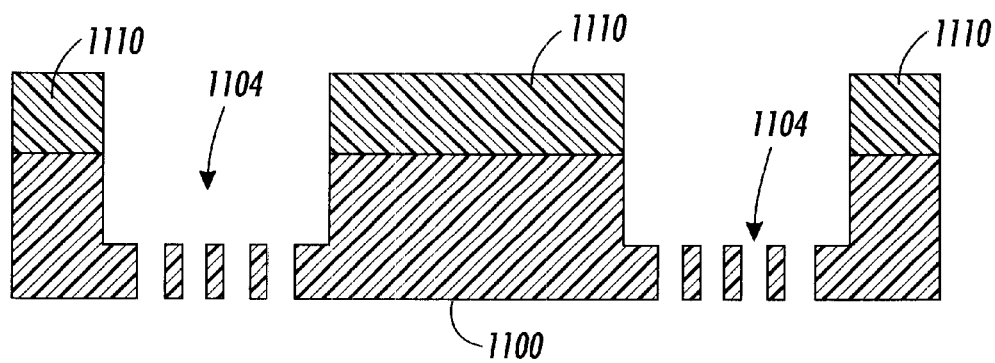
Figure 16:
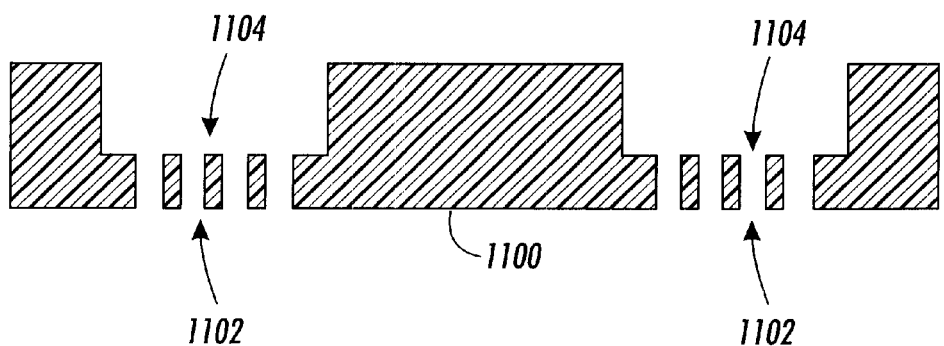

The etching of the substrate 1100 is then completed by another Bosch etch using the first photoresist layer 1110. The large features L are Bosch etched at this time to form wells 1104. As illustrated in FIG. 15, this second Bosch etch causes the vias 1102 to propagate into the substrate 1100 ahead of the wells 1104.

Finally, once both Bosch etch steps are completed, the first photoresist layer 1110 is removed. Since the first photoresist layer 1110 is inert to the chemical rinsing agent acetone, removal cannot be accomplished by rinsing in acetone. Other suitable techniques must be used. For example, the first photoresist layer 1110 may be removed by hot n-methyl pyrrolidinone (NMP) or with a plasma oxygen strip.

Each of the vias 1102 thus fabricated form the ink feed 112 shown in FIG. 1. These vertical-walled vias 1102 extend through the substrate 1100 with minimal impact on the substrate 1100 and the strength of the micromachined liquid ejectors. Each of the vias 1102 may provide ink feeds that are slightly larger than the corresponding piston of the individual ejectors, thus allowing liquid to fill around each piston from the corresponding ink feed. Each of the wells 1104 provide an area for a fluid reservoir behind an array of liquid ejectors.

The methods of the invention are not limited to the photoresist layers described above. On the contrary, the methods of the invention contemplate any existing or hereafter developed masking materials and/or techniques. Also, any suitable existing or hereafter developed treatment for rendering the first mask inert to various suitable chemical rinsing agents are within the scope of the inventive methods.

Referring now to FIG. 17, the two-step etching process of this invention may be carried out as described above in accordance with the following steps. Beginning the process in step S1700, a first mask layer is formed over a surface of a layer of material to define at least one large feature in step S1710. The first mask layer is then treated in step S1720. Next, in step S1730, a second mask layer is formed over the first mask layer to define at least one small feature.

The at least one small feature is etched into the layer of material using the second mask layer in step S1740. Then, in step S1750, the second mask layer is removed by a technique that the first mask layer is resistant to because of the treatment in step S1720.

The at least one large feature is etched into the layer of material using the first mask layer in step S1760. This causes the at least one small feature to propagate into the layer of material ahead of the at least one large feature. Once the large and small features are completely etched, the first mask layer is removed by a suitable technique in step S1770. The process ends in step S1780.

In various exemplary embodiments of the methods of the present invention, once the micromachined device is substantially formed, the substrate may be subjected to the above-described two-step etching process to remove a portion of the substrate. It should be understood that the methods of the present invention also contemplate other existing or hereafter developed etching techniques for removing the portion of the substrate.

When using the SUMMiT process to fabricate a micromachined liquid ejector as described above, the conformal nature of the steps leads to two distinct piston design configurations. In either configuration, various exemplary embodiments of the methods of the present invention include a step of forming an ink feed in the substrate.

Figure 18:
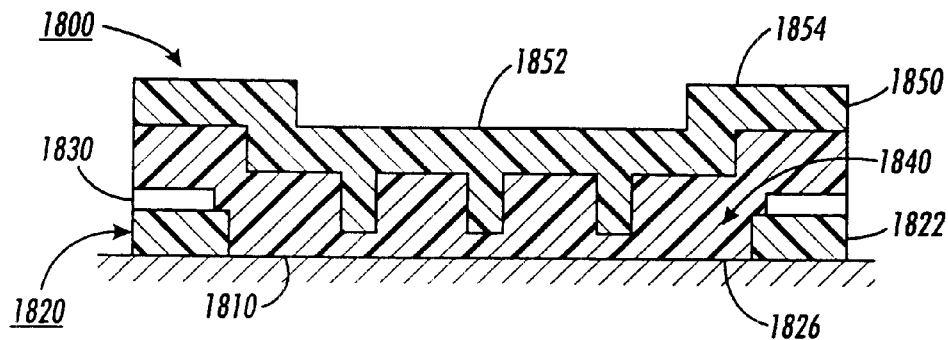
FIGS. 18–19 are cross-sectional views of a layer during various stages of a third exemplary embodiment of a method for fabricating a fluid ejection device according to this invention.
Figure 19:
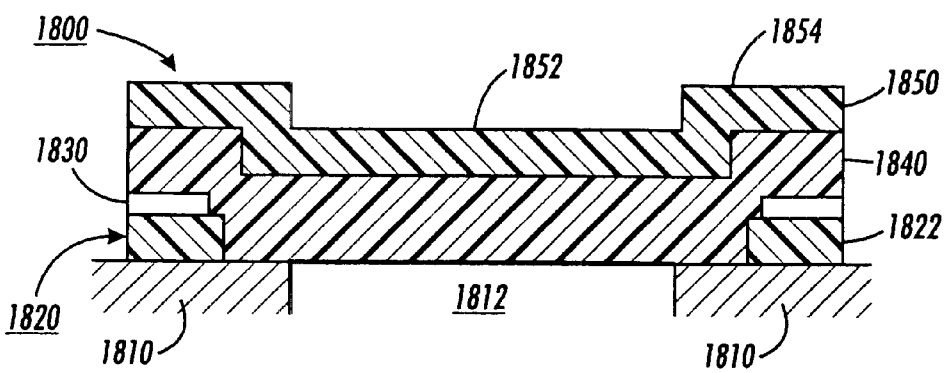

One configuration of a piston assembly 1800, called a "bathtub" configuration, is shown in FIGS. 18 and 19. The piston assembly 1800 shown includes a substrate 1810, an insulating layer 1820, a first polysilicon layer 1830, a first layer of sacrificial material 1840 and a second polysilicon layer 1850, formed using the SUMMiT process as described above. A piston 1852 with springs 1854 is fabricated in the second polysilicon layer 1850.

In this configuration, a cut 1826 is formed in the insulating layer 1820 of silicon nitride to facilitate the fabrication of an ink feed 1812. With the nitride cut 1826, etching to fabricate the ink feed 1812 stops at the first layer of sacrificial material 1840 below the piston 1852, as shown in FIG. 19. The substrate-facing surface of the piston 1852 may then be released by a release etch of a hydrofluoric acid mixture through the ink feed 1812. As a result of the nitride cut 1826, the piston 1852 of the bathtub design is offset from the springs 1854 that support it. Therefore, the piston 1852 appears similar to a microfabricated bathtub.

Figure 20:
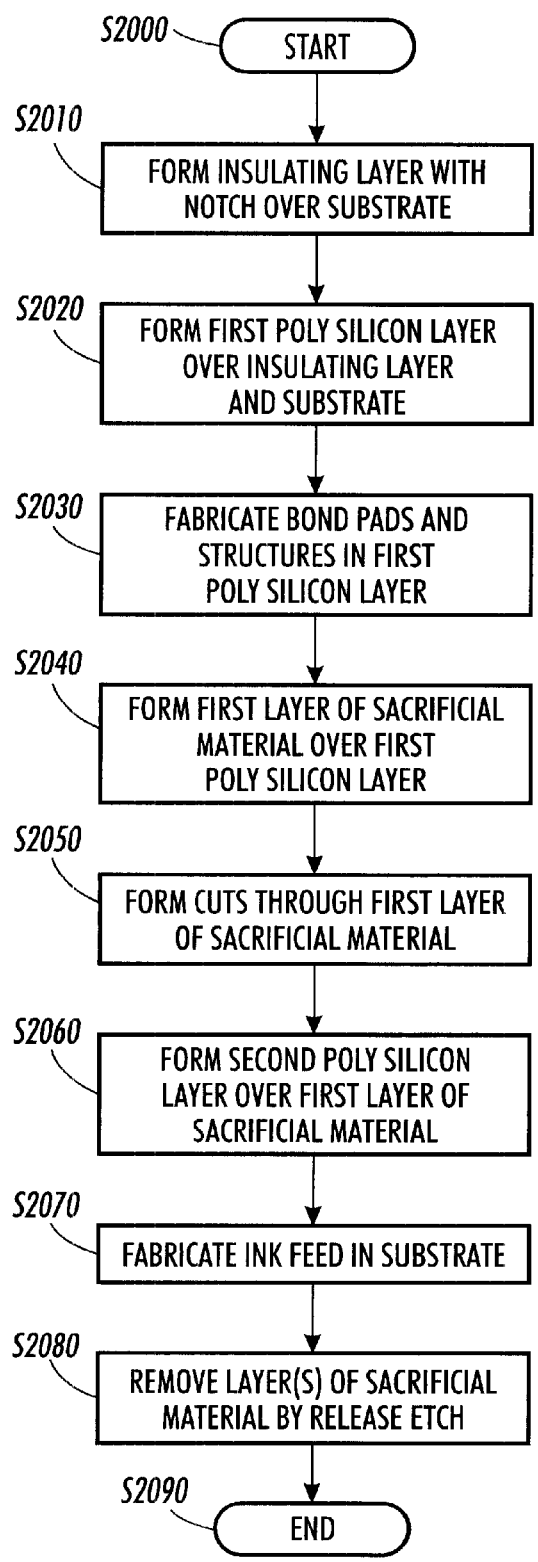
FIG. 20 is a flowchart outlining the third exemplary embodiment of FIGS. 18–19.

An illustrative flowchart for various exemplary embodiments of forming the bathtub configuration is shown in FIG. 20. The process begins in step S2000. An insulating layer with a notch is formed over the substrate in step S2010. Then, in step S2020, a first polysilicon layer is formed over the insulating layer. Structures, such as the bond pads, are fabricated in the first polysilicon layer in step S2030.

Next, a first layer of sacrificial material is formed over the first polysilicon layer in step S2040. Cuts through the first layer of sacrificial material may be formed in step S2050. After any desired cuts are made, a second polysilicon layer is formed over the first layer of sacrificial material in step S2060.

To complete the process, an ink feed is fabricated in the substrate in step S2070. Then, in step S2080, all layers of sacrificial material are removed, for example, by a release etch of a hydrofluoric acid mixture. The process ends in step S2090.

Figure 21:
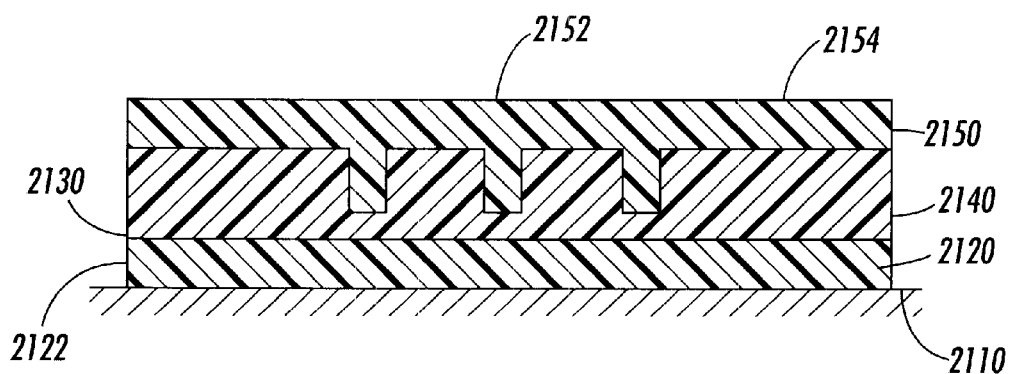
FIGS. 21–22 are cross-sectional views of a layer during various stages of a fourth exemplary embodiment of a method for fabricating a fluid ejection device according to this invention.
Figure 22:
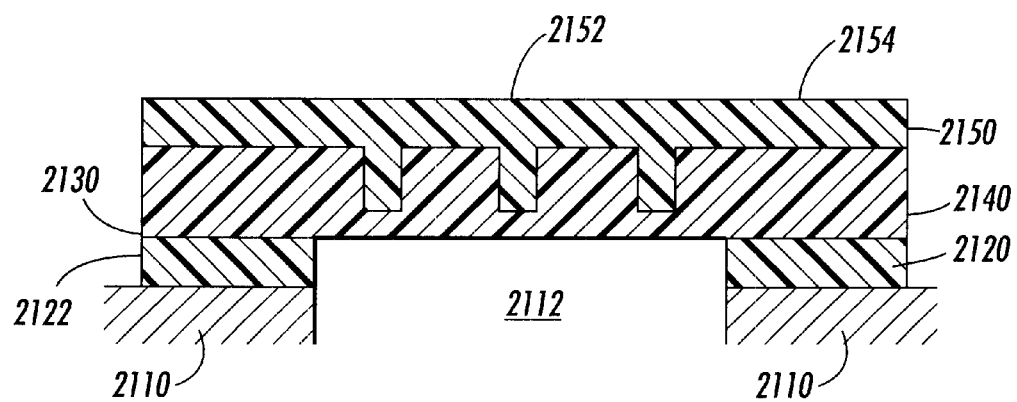

A second configuration of a piston assembly 2100, called a "flat" configuration, is shown in FIGS. 21 and 22. The piston assembly 2100 shown includes a substrate 2110, an insulating layer 2120, a first polysilicon layer 2130, a first layer of sacrificial material 2140 and a second polysilicon layer 2150, formed using the SUMMiT process as described above. For reasons described further below, the insulating layer 2120 is formed only by a silicon nitride layer 2122. A piston 2152 with springs 2154 is fabricated in the second polysilicon layer 2150.

In this configuration, no cut is provided in the nitride insulating layer 2120. Therefore, an extra etch is required to remove a portion of the nitride insulating layer 2120 below the piston 2152 to form an ink feed 2112. For example, a reactive ion etch (RIE) may be used to etch through the nitride insulating layer 2120.

Figure 23:
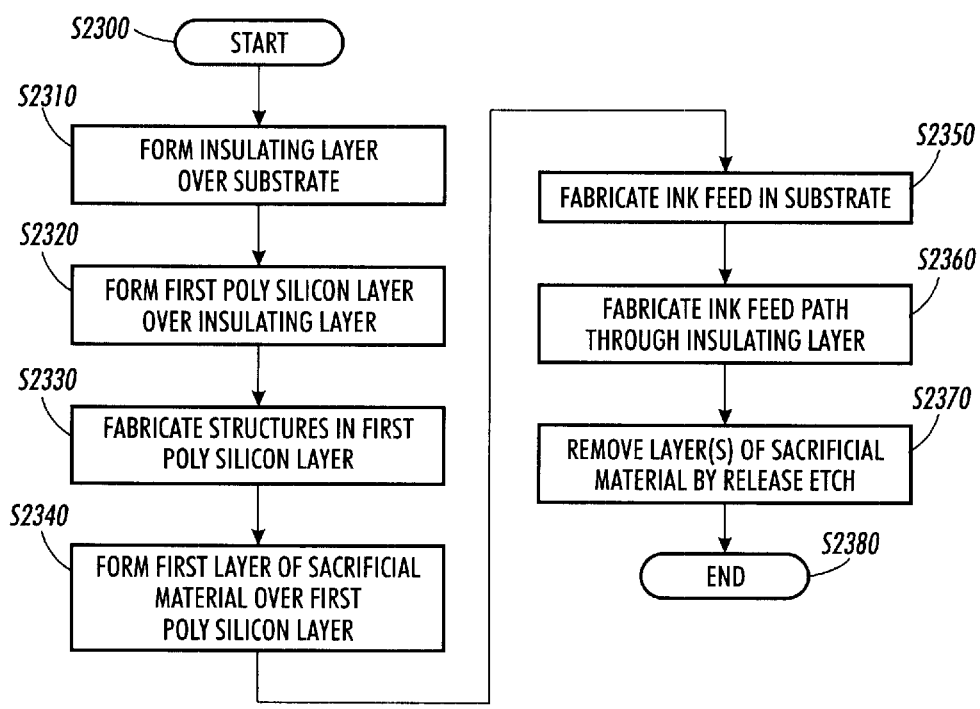
FIG. 23 is a flowchart outlining the fourth exemplary embodiment of FIGS. 21–22.

An illustrative flowchart for various exemplary embodiments of forming the flat configuration is shown in FIG. 23. The process begins in step S2300. An insulating layer is formed over the substrate in step S2310. Then, in step S2320, a first polysilicon layer is formed over the insulating layer. Structures are fabricated in the first polysilicon layer in step S2330.

Next, a first layer of sacrificial material is formed over the first polysilicon layer in step S2340. Then, an ink feed is fabricated in the substrate in step S2350 and an ink feed path is fabricated through the insulating layer in step S2360. Then, in step S2370, all layers of sacrificial material are removed, for example, by a release etch of a hydrofluoric acid mixture. The process ends in step S2380.

Figure 24:
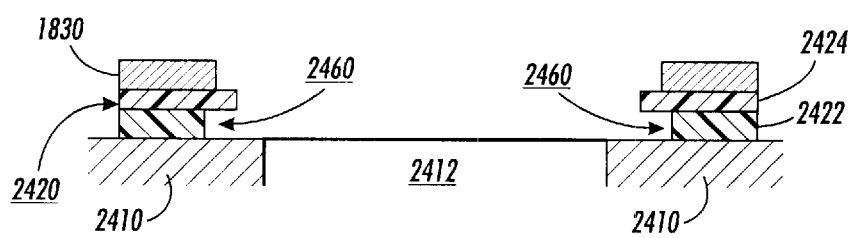
FIG. 24 is a partial cross-sectional view of an exemplary embodiment of the bathtub configuration of FIGS. 18–19, illustrating an undercut problem that may occur when the insulating layer is formed by an oxide and a nitride.

In order to facilitate the extra etch as well as the release etch, the insulating layer of both configurations may be formed without deposition of a layer of oxide the nitride layer. FIG. 24 shows a partial view of an exemplary embodiment of a bathtub configuration. An insulating layer 2420 is formed over the substrate 2410. The insulating layer 2420 includes an oxide layer 2422 and a nitride layer 2424. An ink feed 2412 is formed in the substrate 2410.

As illustrated in FIG. 24, an undercut 2460 may be encountered for these etches when the oxide layer 2422 is part of the insulating layer 2420. Thus, by forming the insulating layer 2420 with only the nitride layer 2424, such an undercut problem may be avoided.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method for forming a structure for channeling fluid into a surface micromachined fluid ejector, comprising:

forming a first mask over a layer of the device, the first mask defining at least one large feature;

treating the first mask so as to render the first mask inert to a chemical rinsing agent;

forming a second mask over the first mask, the second mask defining at least one small feature;

etching the at least one small feature into the layer;

removing the second mask using the chemical rinsing agent after the at least one small feature is etched; and etching the at least one large feature into the layer whereby the at least one small feature propagates into ahead of the at least one large feature.

2. The method according to claim 1, wherein the at least one large feature is a well and the at least one large feature is a via.

3. The method according to claim 1, wherein the layer comprises a substrate of the device.

4. The method according to claim 3, wherein the at least one large feature is a well and the at least one large feature is a via.

5. The method according to claim 1, further comprising:

removing the first mask after the at least one large feature is etched.

6. The method according to claim 5, wherein the first mask is removed by one of a hot wet strip and a plasma oxygen strip.

7. The method according to claim 1, wherein the first mask is a first photoresist layer and is heat treated to render the first photoresist layer mask inert to the chemical rinsing agent.

8. The method according to claim 7, wherein the second mask is a second photoresist layer and is removed using acetone as the chemical rinsing agent, the first photoresist layer being inert to acetone.

9. The method according to claim 8, further comprising:

removing the first photoresist layer after the at least one large feature is etched.

10. The method according to claim 9, wherein the first photoresist layer is removed by one of a hot wet strip and a plasma oxygen strip.

11. A method for forming a surface micromachined fluid ejector, comprising:

forming a layer of sacrificial material over a substrate of the device;

forming at least one cut in the layer of sacrificial material such that the at least one cut extends only partially into the layer of sacrificial material;

forming a polysilicon layer over the layer of sacrificial material;

fabricating a piston in the polysilicon layer such that the piston is located over the at least one cut in the layer of sacrificial material;

removing the layer of sacrificial material such that at least one feature corresponding to the at least one cut is formed on a substrate-facing surface of the piston.

12. The method of claim 11, wherein the at least one cut in the layer of sacrificial material comprises a plurality of grooves so that the at least one feature formed on the substrate-facing surface of the piston comprises a corresponding plurality of ribs.

13. The method of claim 12, wherein at least one of the plurality of grooves is arranged to intersect at least one other of the plurality of grooves.

14. The method of claim 13, wherein the plurality of grooves is arranged to form a grid-like pattern so that the plurality of ribs form a waffle pattern.

* * * * *

UNITED STATES PATENT AND TRADEMARK OFFICE
CERTIFICATE OF CORRECTION

PATENT NO. : 6,472,332 B1  Page 1 of 1
DATED : October 29, 2002
INVENTOR(S) : Gooray et al.

It is certified that error appears in the above-identified patent and that said Letters Patent is hereby corrected as shown below:

Column 1,
Line 4, please insert the following paragraph:
-- GOVERNMENT RIGHTS
This invention was made with Government support under Contract No. DE-AC04-94AL85000 awarded by the U.S. Department of Energy. The Government has certain rights in this invention. --

Signed and Sealed this

Twenty-fifth Day of February, 2003

JAMES E. ROGAN
*Director of the United States Patent and Trademark Office*